United States Patent
Tiwari et al.

(10) Patent No.: US 11,423,247 B2
(45) Date of Patent: Aug. 23, 2022

(54) IDENTIFYING FIXED BITS OF A BITSTRING FORMAT

(71) Applicant: SRI International, Menlo Park, CA (US)

(72) Inventors: Ashish Tiwari, Menlo Park, CA (US); Susmit Jha, Redwood City, CA (US); Patrick Lincoln, Woodside, CA (US)

(73) Assignee: SRI INTERNATIONAL, Menlo Park, CA (US)

( * ) Notice: Subject to any disclaimer, the term of this patent is extended or adjusted under 35 U.S.C. 154(b) by 323 days.

(21) Appl. No.: 16/839,982

(22) Filed: Apr. 3, 2020

(65) Prior Publication Data
US 2020/0394446 A1 Dec. 17, 2020

Related U.S. Application Data

(60) Provisional application No. 62/861,231, filed on Jun. 13, 2019.

(51) Int. Cl.
| | |
|---|---|
| *H03M 7/34* | (2006.01) |
| *H03M 7/00* | (2006.01) |
| *G06K 9/62* | (2022.01) |
| *G06F 9/54* | (2006.01) |
| *H03M 7/30* | (2006.01) |
| *H03M 7/40* | (2006.01) |

(52) U.S. Cl.
CPC ........... *G06K 9/6215* (2013.01); *G06F 9/546* (2013.01); *H03M 7/4031* (2013.01); *H03M 7/60* (2013.01)

(58) Field of Classification Search
CPC .... G06K 9/6215; G06F 9/546; H03M 7/4031; H03M 7/60; H03M 7/3066; H03M 7/3068

USPC ...................................................... 341/50, 51
See application file for complete search history.

(56) References Cited

U.S. PATENT DOCUMENTS

| | | | |
|---|---|---|---|
| 7,161,507 B2 * | 1/2007 | Tomic | H03M 7/40 341/51 |
| 7,653,520 B2 | 1/2010 | De Moura et al. | |
| 9,128,697 B1 * | 9/2015 | Potter | G06F 9/30192 |
| 9,740,655 B2 * | 8/2017 | Hartwich | G06F 13/4221 |
| 9,772,849 B2 * | 9/2017 | Evans | G06F 9/30196 |
| 10,886,942 B2 * | 1/2021 | Rovers | G06F 7/49915 |

(Continued)

OTHER PUBLICATIONS

"DARPA, Lockheed Martin Demonstrate Technologies to Enable a Connected Warfighter Network," Lockheed Martin Aeronautics Company, Jul. 13, 2018. 3 pp.

*Primary Examiner* — Jean B Jeanglaude
(74) *Attorney, Agent, or Firm* — Shumaker & Sieffert, P.A.

(57) ABSTRACT

Techniques are disclosed for identifying fixed bits of a bitstring format. One or more processors are configured to generate a first bitstring having respective first bit values that have a first satisfiability state and generate a second bitstring having respective second bit values that have a second satisfiability state. The one or more processors are configured to identify first potential free bits having respective first common values and generate a third bitstring having first potential free bits with the respective first common values and third remaining bits. The one or more processors are configured to identify second potential free bits having respective second common values and identify a fixed bit that is not included in the first potential free bits and is not included in the second potential free bits.

20 Claims, 7 Drawing Sheets

(56) References Cited

U.S. PATENT DOCUMENTS

2006/0055569 A1* 3/2006 Tomic .................... H03M 7/40
                                                          341/50
2007/0040710 A1* 2/2007 Tomic .................... H03M 7/40
                                                          341/50
2014/0328357 A1* 11/2014 Fredriksson ........ H04L 12/4135
                                                         370/520
2015/0339254 A1* 11/2015 Hartwich .............. H04L 1/0083
                                                         710/106
2016/0359576 A1* 12/2016 Fredriksson .......... H04J 3/0614
2018/0175958 A1* 6/2018 Fredriksson ........ H04L 12/4135
2019/0363814 A1* 11/2019 Fredriksson .......... H04J 3/0614

* cited by examiner

IDENTIFYING FIXED BITS OF A BITSTRING FORMAT

This application claims the benefit of U.S. Provisional Application No. 62/861,231 filed on Jun. 13, 2019, the entire content of which is incorporated herein by reference.

GOVERNMENT RIGHTS

This invention was made with Government support under Contract FA8650-14-C-7438 awarded by the Defense Advanced Research Project Agency (DARPA). The Government has certain rights in the invention.

TECHNICAL FIELD

This disclosure generally relates to computing systems.

BACKGROUND

In a flow of information encoded in different data formats, some bits are not used. For example, valid data for a given message format may only partially fill certain fields or just fill relevant fields.

SUMMARY

In general, the disclosure describes techniques for computing free bits and fixed bits in data structures, for example, as the free bits and fixed bits are passed through software-defined protocols in a software architecture. Such techniques may use a polynomial-time process that scales well, compared to systems that analyze each combination of bits, for complex data formats that have a large number of fields and/or a large number of network components. For example, techniques described herein may include an iterative process to identify potential free bits by generating a bitstring that satisfies a bitstring format (e.g., a protocol format, a storage rule, etc.) and a bitstring that does not satisfy the bitstring format, then adjusting one the bitstrings to eventually determine relevant bits within the bitstring format that must be fixed to a particular value in order to satisfy the bitstring format. In this way, techniques described herein may find free bits and fixed bits in a bitstring format more efficiently that systems that analyze each combination of bits in the bitstring format, which may improve a computational efficiency of the system.

Additionally, techniques described herein may help to allow systems configured for different protocols to communicate. For example, rather than relying on configuring each system of a set of systems with a particular protocol or relying on configuring each system of the set of systems with all of the protocols used by the set of systems to allow communication between each of the systems, techniques described herein may configure each system to communicate using one or more free bits that satisfy a bitstring format for the set of systems. In this way, techniques described herein may help to automatically construct transcoders that enable transmission of data over existing channels, which may improve a data throughput of the set of systems.

Techniques described herein may help to allow a higher data compression rate of a communication channel. For example, a system may be configured to add additional information for transmission on a communication channel to an original message. In this way, techniques described herein may help to "compress" data on the communication channel, which may improve a data throughput of the system.

In one example, this disclosure describes a system for identifying fixed bits of a bitstring format, the system comprising: one or more processors implemented in circuitry and configured to: generate a first bitstring having, for a first set of bits of the first bitstring, respective first bit values that have a first satisfiability state for requirements of the bitstring format; generate a second bitstring having, for a second set of bits of the second bitstring, respective second bit values that have a second satisfiability state for the requirements of the bitstring format, the second satisfiability state different than the first satisfiability state; identify first potential free bits having respective first common values in the first set of bits and in the second set of bits; generate a third bitstring having, for a third set of bits of the third bitstring, the first potential free bits with the respective first common values and third remaining bits, the third set of bits having respective third bit values that have the second satisfiability state for the requirements of the bitstring format; identify second potential free bits in the first set of bits and in the third set of bits having respective second common values; identify a fixed bit that is not included in the first potential free bits and is not included in the second potential free bits; output an indication of the fixed bit and a fixed bit value of the fixed bit, the fixed bit value being a corresponding value for the fixed bit that satisfies the requirements of the bitstring format; and a plurality of nodes implemented in circuitry, wherein each node of the plurality of nodes is configured to: in response to receiving the indication of the fixed bit and fixed bit value of the fixed bit, generate one or more bitstrings having the fixed bit value for the fixed bit to satisfy at least one of the requirements of the bitstring format.

In another example, this disclosure describes a method for identifying fixed bits of a bitstring format, the method performed by a computing system and comprising: generating a first bitstring having, for a first set of bits of the first bitstring, respective first bit values that have a first satisfiability state for requirements of the bitstring format; generating a second bitstring having, for a second set of bits of the second bitstring, respective second bit values that have a second satisfiability state for the requirements of the bitstring format, the second satisfiability state different than the first satisfiability state; identifying first potential free bits having respective first common values in the first set of bits and in the second set of bits; generating a third bitstring having, for a third set of bits of the third bitstring, the first potential free bits with the respective first common values and third remaining bits, the third set of bits having respective third bit values that have the second satisfiability state for the requirements of the bitstring format; identifying second potential free bits in the first set of bits and in the third set of bits having respective second common values; identifying a fixed bit that is not included in the first potential free bits and is not included in the second potential free bits; and outputting an indication of the fixed bit and a fixed bit value of the fixed bit, the fixed bit value being a corresponding value for the fixed bit that satisfies the requirements of the bitstring format.

In one example, this disclosure describes a system comprising: a first node; a second node that exchanges data with the first node using first protocol messages that conform to a first bitstring format for a first protocol, the first bitstring format having one or more first fixed bits with respective bit values required to satisfy requirements of the first protocol and also having one or more first free bits; and a third node that exchanges data with the second node using second protocol messages that conform to a second bitstring format for a second protocol, the second bitstring format having one or more second fixed bits with respective bit values required to satisfy requirements of the second protocol and also having one or more second free bits.

In another example, this disclosure describes a non-transitory computer-readable medium comprising instructions for identifying fixed bits of a bitstring format, the instructions configured to cause processing circuitry to: generate a first bitstring having, for a first set of bits of the first bitstring, respective first bit values that have a first satisfiability state for requirements of the bitstring format; generate a second bitstring having, for a second set of bits of the second bitstring, respective second bit values that have a second satisfiability state for the requirements of the bitstring format, the second satisfiability state different than the first satisfiability state; identify first potential free bits having respective first common values in the first set of bits and in the second set of bits; generate a third bitstring having, for a third set of bits of the third bitstring, the first potential free bits with the respective first common values and third remaining bits, the third set of bits having respective third bit values that have the second satisfiability state for the requirements of the bitstring format; identify second potential free bits in the first set of bits and in the third set of bits having respective second common values; identify a fixed bit that is not included in the first potential free bits and is not included in the second potential free bits; output an indication of the fixed bit and a fixed bit value of the fixed bit, the fixed bit value being a corresponding value for the fixed bit that satisfies the requirements of the bitstring format.

The details of one or more examples of the techniques of this disclosure are set forth in the accompanying drawings and the description below. Other features, objects, and advantages of the techniques will be apparent from the description and drawings, and from the claims.

BRIEF DESCRIPTION OF DRAWINGS

Like reference characters refer to like elements throughout the figures and description.

DETAILED DESCRIPTION

Figure 1:
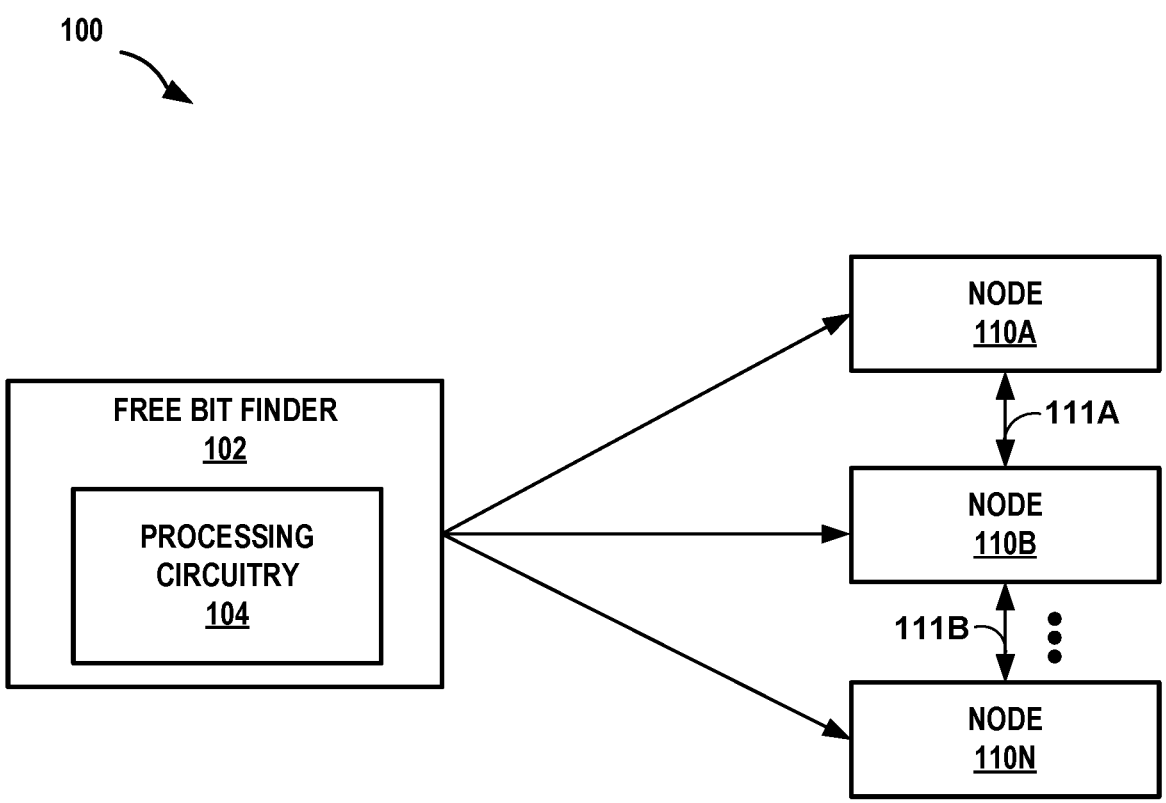
FIG. 1 is a block diagram illustrating an example system for identifying fixed bits of a bitstring format, in accordance with the techniques of the disclosure.

This disclosure describes inventive concepts with reference to specific examples. However, the intent is to cover all modifications, equivalents, and alternatives of the inventive concepts that are consistent with this disclosure. It will be apparent, however, to one of ordinary skill in the art that the present approach can be practiced without these specific details. Thus, the specific details set forth are merely exemplary, and is not intended to limit what is presently disclosed. The features implemented in one embodiment may be implemented in another embodiment where logically possible. The specific details can be varied from and still be contemplated to be within the spirit and scope of what is being disclosed.

Some systems may compute free bits and fixed bits in data structures as they are passed through software-defined protocols in an existing software architecture. For example, a system may determine aspects of messages that can be repurposed to enable new communication modes. Specifically, in a given flow of information encoded in data formats, some of the messages may not use certain fields, or may only partially fill certain fields in the fixed message format. Some systems may be configured to consider each combination of possible ways to use the unfilled portions of fixed format messages. However, such systems do not scale well to complex data formats, large numbers of fields, or large networks of components.

In accordance with the techniques of the disclosure, a system may be configured to use a polynomial-time process to determine free bits and fixed bits in a bitstring format in a given system architecture. Rather than using an algorithm with time complexity of N*N time for problems of total size N, a system operating according to the described techniques may be configured to use an algorithm to enable N*log(N) time complexity. Extensions of the algorithm enabling N*log(N) time complexity may be configured to process complex data types, such as, for example, structured data or hierarchical data. Extensions of the algorithm enabling N*log(N) time complexity may be configured to process nameless functions (e.g., lambda terms), array expressions, and local naming (e.g., let expressions).

Some systems of systems (SoS) may use a first protocol for communications between a first system and a second system and a second protocol for communications between the second system and a third system. To exchange data between the first system and the third system via the second system, the first system, the second system, and the third system may each be configured to support a single protocol (e.g., the first protocol or the second protocol). However, such systems do not scale well as each system must be configured to support the single protocol. Alternatively, the first system may be configured to support a both the first protocol and the second protocol such that data transmitted to the second system is compliant with both the first protocol and the second protocol. However, such systems do not scale well because each protocol of the system of systems must be supported by all systems of the system of systems.

Techniques described herein may help to allow systems of systems to communicate using one or more free bits that satisfy a bitstring format for the set of systems. For example, a system of systems may be configured to use a first protocol for communications between a first system and a second system and a second protocol for communications between the second system and a third system. In this example, the first system may be configured to use free bits to exchange data to the third system via the second system. In this way, techniques described herein may help to automatically construct transcoders that enable transmission of data over existing channels without knowledge of various protocols supported by each system, which may improve a data throughput of the system of systems.

FIG. 1 is a block diagram illustrating an example system 100 for identifying fixed bits of a bitstring format, in accordance with the techniques of the disclosure. As shown, system 100 may include free bit finder 102 and nodes 110A-110N (collectively, "nodes 110"). System 100 is for example purposes only. For example, system 100 may include additional or fewer components.

Free bit finder 102 may be configured to determine free bits of a bitstring format. As used herein, a free bit may refer to a bit that can be repurposed to enable new communication modes. For example, a free bit may be a bit of a bitstring format that is not used for a protocol defining a bitstring format of the bitstring. As another example, a free bit may be a bit of a bitstring format that is not used for a storage rule of the bitstring. A free bit may be a bit of a bitstring format that corresponds to an unused field of a message format, for instance. In contrast, a fixed bit may refer to a bit that cannot be repurposed, e.g., to enable new communication modes or to enable new storage rules for a storage format. For example, a fixed bit may refer to a bit of a bitstring format that is used by a protocol and that must have a particular value in a bitstring in order for that bitstring to be an acceptable bitstring of the bitstring format. For example, a fixed bit may refer to a bit of a bitstring format that is used by a storage rule and that must have a particular value in a bitstring in order for that bitstring to be an acceptable bitstring of the bitstring format. A fixed bit may be a bit of a bitstring format that corresponds to a used field of a message format, for instance. In the example of FIG. 1, free bit finder 102 includes processing circuitry 104. Processing circuitry 104 may include any one or more of a microprocessor, a controller, a digital signal processor (DSP), an application specific integrated circuit (ASIC), a field-programmable gate array (FPGA), or equivalent discrete or integrated logic circuitry.

Each of nodes 110 may include processing circuitry that generates bits of a bitstring format. Each of nodes 110 may be, for instance, a controller, a computer, a sensor, an appliance, or a mobile device. Nodes 110 may be components of a larger system, such as a vehicle or distributed computing system. Processing circuitry of nodes 110 may include any one or more of a microprocessor, a controller, a digital signal processor (DSP), an application specific integrated circuit (ASIC), a field-programmable gate array (FPGA), or equivalent discrete or integrated logic circuitry.

Nodes 110 may communicate to each other over communication links according to a communication protocol. For example, node 110A may communicate with node 110B using protocol session 111A. Node 110B may communicate with node 110C using protocol session 111B. Protocols sessions 111 may operate according to well-defined message formats.

Free bit finder 102 may automatically construct transcoders that enable transmission of new data over existing channels (e.g., protocol sessions 111). For example, free bit finder 102 may be configured to identify free bits of protocol sessions 111. Node 110A can include data in free bits of a message according to a first protocol to be received by node 110B using protocol session 111A. In this example, node 110B can include data in free bits of a message according to a second protocol to be received by node 110N using protocol session 111B. In this way, node 110A may output data to node 110N using existing protocols operating between nodes 110.

In accordance with the techniques of the disclosure, processing circuitry 104 may generate a first bitstring having, for a first set of bits of the first bitstring, respective first bit values that have a first satisfiability state for requirements of the bitstring format. For example, processing circuitry 104 may generate a first bitstring having bits [0, 0, 0, 0] that satisfies a protocol format. In this example, processing circuitry 104 may generate a second bitstring having, for a second set of bits of the second bitstring, respective second bit values that have a second satisfiability state for the requirements of the bitstring format, the second satisfiability state different than the first satisfiability state. For example, processing circuitry 104 may generate a second bitstring having bits [0, 0, 1, 1] that does not satisfy the protocol format.

Processing circuitry 104 may identify first potential free bits having respective first common values in the first set of bits and in the second bits. For example, processing circuitry 104 may identify first potential free bits to be the first two bits of the four-bit bitstring (e.g., [0, 0]).

Processing circuitry 104 may generate a third bitstring having, for a third set of bits of the third bitstring, the first potential free bits with the respective first common values and third remaining bits, the third set of bits having respective third bit values that have the second satisfiability state for the requirements of the bitstring format. For example, processing circuitry 104 may generate a third bitstring having bits [0, 0, 0, 1] that does not satisfy the protocol format.

Processing circuitry 104 may identify second potential free bits in the first set of bits and in the third set of bits having respective second common values. For example, processing circuitry 104 may identify second potential free bits to be the first three bits of the four-bit bitstring (e.g., [0, 0, 0]). Processing circuitry 104 may identify a fixed bit that is not included in the first potential free bits and is not included in the second potential free bits. For example, processing circuitry 104 may identify the last bit of the four-bit bitstring as a fixed bit. Processing circuitry 104 may output an indication of the fixed bit and a fixed bit value of the fixed bit, the fixed bit value being a corresponding value for the fixed bit that satisfies the requirements of the bitstring format. For example, processing circuitry 104 may output, to nodes 110, an indication of the fixed bit (e.g., a mask [0, 0, 0, 1]) and a fixed bit value of the fixed bit (e.g., '1') that satisfies the requirements of a protocol format.

In response to receiving the indication of the fixed bit and fixed bit value of the fixed bit, nodes 110 may generate one or more bitstrings having the fixed bit value for the fixed bit to satisfy at least one of the requirements of the bitstring format. For example, node 110A may generate a four-bit bitstring having a value '1' in the fourth bit to satisfy a protocol format. In this example, nodes 110 may repurpose the free bits (e.g., the first three bits of the bitstring) for sending data. Techniques for using indications of free bits are described in further detail below with respect to FIG. 3

For example, node 110B may exchanges data with node 110A using first protocol messages that conform to a first bitstring format for a first protocol (e.g., using protocol session 111A). The first bitstring format may have one or more first fixed bits with respective bit values required to satisfy requirements of the first protocol (e.g., a four-bit bitstring having a value '1' in the fourth bit to satisfy a protocol format) and also having one or more first free bits (e.g., the first three bits of the bitstring). In some examples, node 11B may receive a received message of the first protocol messages that includes a first bitstring having first bit values for the one or more first free bits of the first bitstring (e.g., "0, 0, 1"). In this example, node 110N exchanges data with node 110B using second protocol messages that conform to a second bitstring format for a second protocol (e.g., using protocol session 111B). The second bitstring format may have second one or more fixed bits with respective bit values required to satisfy requirements of the second protocol (e.g., a four-bit bitstring having a value '1' in the fourth bit to satisfy a protocol format) and also having second one or more free bits (e.g., the first three bits of the bitstring). In some examples, node 110B may generate a generated message of the second protocol messages that includes a second bitstring having at least some of the first bit values from the received message as bit values of the second one or more free bits for the second bitstring (e.g., "0, 0, 1").

While the foregoing example uses 4 bits other examples may use more than 4 bits. Moreover, while the example of FIG. 1 used a protocol format other bitstring formats may be used, for example, processing circuitry 104 may be configured to identify fixed bits and/or free bits for of one or more storage rules for a storage system.

Techniques described herein may help to improve a computational efficiency of processing circuitry 104 compared to systems that that analyze each combination of bits in the bitstring. For example, a system that identifies free bits by analyzing each combination of bits in the bitstring would use a processing effort corresponding to a time complexity of N*N or $O(n^2)$ for bit strings having N number of bits. In contrast, techniques described herein for identifying fixed bits of a bitstring format may enable processing circuitry 104 to identify free bits that use a processing effort corresponding to a time complexity of N*log(N) or O(n log n), which is a significant reduction in computational effort.

Additionally, techniques described herein may help to allow nodes 110, which may be each configured for different protocols to communicate. For example, rather than relying on configuring each node of nodes 110 with a particular protocol or relying on configuring each node of nodes 110 with all of the protocols used by nodes 110 to allow communication between each node of nodes 110, techniques described herein may configure each node of nodes 110 to communicate using one or more free bits identified by processing circuitry 104 that satisfy a bitstring format for nodes 110. In this way, techniques described herein may help to automatically construct transcoders that enable transmission of data over protocol sessions 111, which may improve a data throughput of communications between nodes 110.

Techniques described herein may help to allow a higher data compression rate of a communication channel. For example, nodes 110 may be configured to add additional information for transmission on protocol sessions 111 to an original message. In this way, techniques described herein may help to "compress" data on a communication channel, which may improve a data throughput of system 100.

Figure 2:
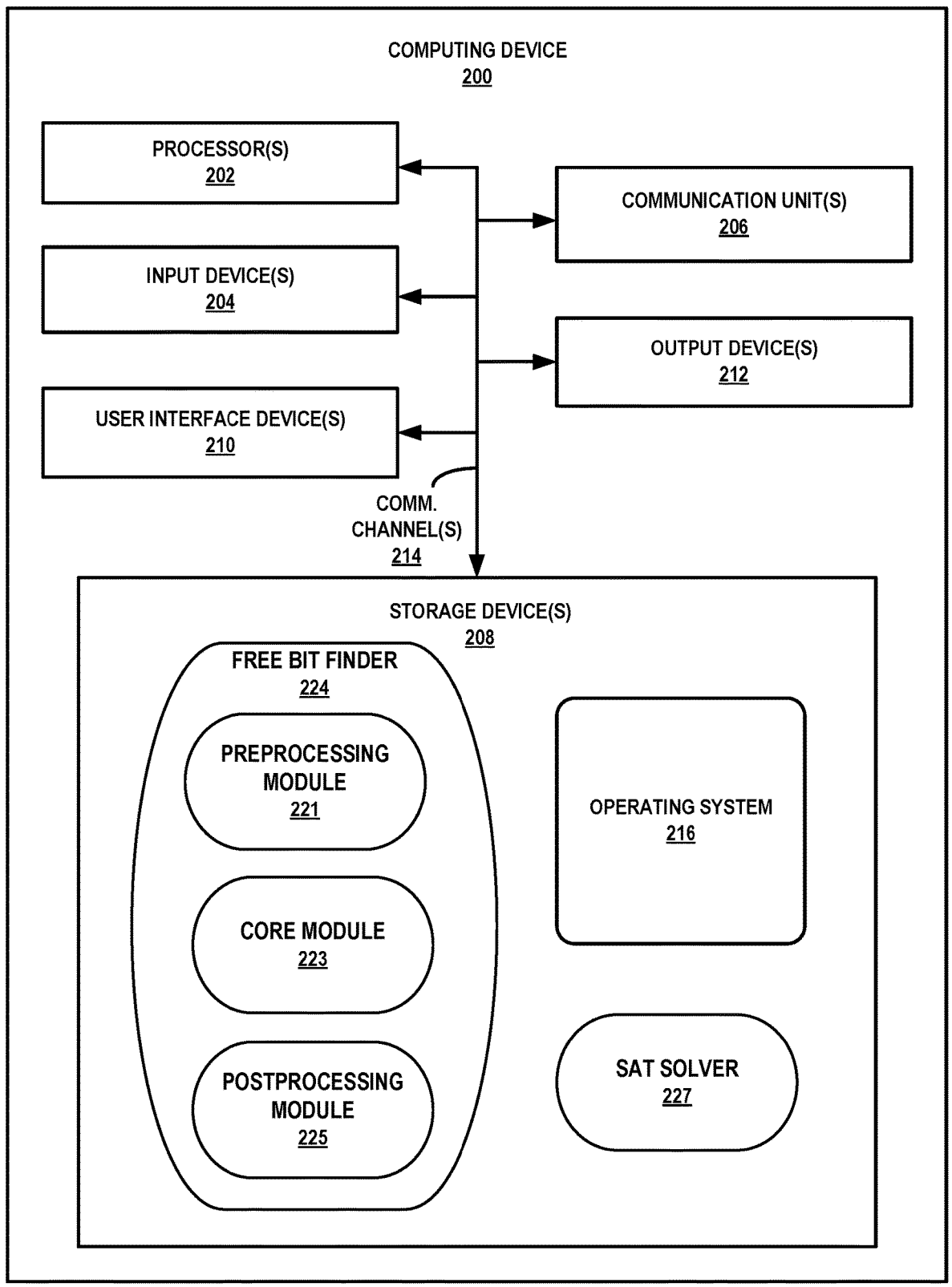
FIG. 2 is a block diagram illustrating an example computing device for identifying fixed bits of a bitstring format, in accordance with the techniques of the disclosure.

FIG. 2 is a block diagram illustrating an example computing device 200 for identifying fixed bits of a bitstring format, in accordance with the techniques of the disclosure. FIG. 2 may illustrate a particular example of a server or other computing device 200 that includes one or more processor(s) 202 for executing at least a portion of free bit finder 224, or any other computing device described herein. Other examples of computing device 200 may be used in other instances. Although shown in FIG. 2 as a stand-alone computing device 200 for purposes of example, a computing device may be any component or system that includes one or more processors or other suitable computing environment for executing software instructions and, for example, need not necessarily include one or more elements shown in FIG. 2 (e.g., computing device 200 may not include communication units 206 and/or user interface devices 210; and in some examples components such as storage device(s) 208 may not be collocated or in the same chassis as other components). Computing device 200 may be located and execute, for example, at another interconnection facility, or at a branch office or cloud computing environment employed or used by a colocation facility or cloud exchange provider.

As shown in the specific example of FIG. 2, computing device 200 includes one or more processors 202, one or more input devices 204, one or more communication units 206, one or more output devices 212, one or more storage devices 208, and one or more user interface (UI) devices 210. Computing device 200, in one example, further includes free bit finder 224, SAT solver 227, and operating system 216 that are executable by computing device 200. Free bit finder 224 and satisfiability (SAT) solver 227 may be applications, processes, libraries, or other executable code. Each of components 202, 204, 206, 208, 210, and 212 are coupled (physically, communicatively, and/or operatively) for inter-component communications. In some examples, communication channels 214 may include a system bus, a network connection, an inter-process communication data structure, or any other method for communicating data. As one example, components 202, 204, 206, 208, 210, and 212 may be coupled by one or more communication channels 214.

Processors 202, in one example, are configured to implement functionality and/or process instructions for execution within computing device 200. For example, processors 202 may be capable of processing instructions stored in storage device 208. Examples of processors 202 may include any one or more of a microprocessor, a controller, a digital signal processor (DSP), an application specific integrated circuit (ASIC), a field-programmable gate array (FPGA), or equivalent discrete or integrated logic circuitry.

One or more storage devices 208 may be configured to store information within computing device 200 during operation. Storage device 208, in some examples, is described as a computer-readable storage medium. In some examples, storage device 208 is a memory device, meaning that a primary purpose of storage device 208 is not long-term data storage. Storage device 208, in some examples, is described as a volatile memory, meaning that storage device 208 does not maintain stored contents when the computer is turned off. Examples of volatile memories include random access memories (RAM), dynamic random access memories (DRAM), static random access memories (SRAM), and other forms of volatile memories known in the art. In some examples, storage device 208 is used to store program instructions for execution by processors 202. Storage device 208, in one example, is used by software or applications running on computing device 200 to temporarily store information during program execution.

Storage devices 208, in some examples, also include one or more computer-readable storage media. Storage devices 208 may be configured to store larger amounts of information than volatile memory. Storage devices 208 may further be configured for long-term storage of information. In some examples, storage devices 208 include non-volatile storage elements. Examples of such non-volatile storage elements include magnetic hard discs, optical discs, floppy discs, flash memories, or forms of electrically programmable memories (EPROM) or electrically erasable and programmable (EEPROM) memories.

Computing device 200, in some examples, also includes one or more communication units 206. Computing device 200, in one example, utilizes communication units 206 to communicate with external devices via one or more networks, such as one or more wired/wireless/mobile networks. Communication units 206 may include a network interface card, such as an Ethernet card, an optical transceiver, a radio frequency transceiver, or any other type of device that can send and receive information. Other examples of such network interfaces may include 3G, 4G, 5G, Bluetooth™, IEEE 802.15.4 (e.g., ZigBee™), and Wi-Fi™ radios. In some examples, computing device 200 uses communication unit 206 to communicate with an external device.

Computing device 200, in various examples, also includes one or more user interface devices 210. User interface devices 210, in some examples, are configured to receive input from a user through tactile, audio, or video feedback. Examples of user interface devices(s) 210 include a presence-sensitive display, a mouse, a keyboard, a voice responsive system, video camera, microphone or any other type of device for detecting a command from a user. In some examples, a presence-sensitive display includes a touch-sensitive screen.

One or more output devices 212 may also be included in computing device 200. Output device 212, in some examples, is configured to provide output to a user using tactile, audio, or video outputs or stimuli. Output device 212, in various examples, includes a presence-sensitive display, a sound card, a video graphics adapter card, or any other type of device for converting a signal into an appropriate form understandable to humans and/or machines. Additional examples of output device 212 include a speaker, a cathode ray tube (CRT) monitor, a liquid crystal display (LCD), or any other type of device that can generate intelligible output to a user.

Computing device 200 may include operating system 216. Operating system 216, in some examples, controls the operation of components of computing device 200. In various examples, operating system 216 may facilitate the communication of one or more applications 222 and free bit finder 224 with processors 202, communication unit 206, storage device 208, input device 204, user interface device 210, and output device 212.

Free bit finder 224 may include program instructions and/or data that are executable by computing device 200. For example, free bit finder 224 may include instructions that cause computing device 200 to identify one or more free bits and/or one or more fixed bits of a bitstring format.

A recursive type definition is discussed in the following. In the recursive type definition a named type declaration is a tuple (x, T), written as x: T, where x is a symbol and T is a type. A recursive type may be either a base type, such as a short, integer (int), float, bool, or byte, or a recursive type of the form $(x_1: T_1, \ldots, x_m: T_m)$, where for all i, x, T; is a named type declaration such that $X_1, \ldots, X_m$ are m distinct symbols, and each $T_i$ is (recursively) a type. In this example, the recursive definition is not cyclic.

A message type definition is discussed in the following. A message type M: $=(x_1: T_1, \ldots, x_m: T_m, \phi(x_1, \ldots, X_m))$ may be a tuple including of a recursive type $(x_1: T_1, \ldots, x_m: T_m)$ and a constraint $\phi$ over the variables $x_1, \ldots, x_m$. Note that a type may denote a set of values (e.g., semantically). Given the semantics of base types, free bit finder 224 may construct the values of the recursive types. For a message type, free bit finder 224 may constrain the set of allowable values to values that satisfy the well-formedness constraint. Free bit finder 224 may be configured to denote [M] by the set of all messages m of type M such that $\phi$ (m) holds, where $\phi$ is the constraint for M.

A transcoding problem is discussed in the following. For a source message type $M_1$ and a destination message type $M_2$, the transcoding problem seeks to find an encoding function d:$M_2$->$M_1$ such that an encoder and a decoder are inverses of each other (e.g., $\forall_m \varepsilon [M_1]$:d(f(m)))=m), such that the encoder maps well-formed $M_1$ messages to well-formed $M_2$ messages (e.g., $\forall_m \varepsilon [M_1]$ f(m)$\varepsilon [M_1]$), which can also be written as $\forall_m$:$\phi_1$(m)->$\phi_2$(f(m))), and such that the decoder maps well-formed $M_2$ messages to well-formed $M_1$ messages (e.g., $\forall_m \varepsilon [M_2]$ d(m)$\varepsilon [M_1]$), which can also be written as $\forall_m$:$\phi_2$(m)->$\phi_1$(d(m))).

For example, each base type value can be represented as a fixed length bitvector. That is, an int is not an ideal integer, but either a 32-bit int, a 16-bit int, a 8-bit int or some fixed length bitvector. Similarly, in this example the constraints $\phi$ are interpreted over finite length bitvectors, and not idealized set of integers or reals. A consequence of the above this example is that often human intuition may fail when looking at the solution of the transcoding problem. For example, if x and y are signed integers, then the sum x+y of x and y may be negative even when both are positive (e.g., due to overflow on fixed bit width addition).

Free bits are discussed in the following. To address the transcoding problem, free bit finder 224 may be configured to determine free bits in a message type rather than synthesizing an encoder and a decoder. For example, free bit finder 224 may be configured to processes bits and constraints of messages as Boolean formulas over the bits of the message. For a given message type M, let $b_M$ denote the number of bits in the message type, and let $\Psi_M(b_M)$ denote the Boolean formula over these bits that defines the well-formedness of message M. If M is clear from the context, free bit finder 224 may denote all the bits by b and the Boolean formula over b by $\Psi(b)$. Free bit finder 224 may define when a set of bits in a message type are considered free as follows.

Let $b_0 \cup b_1$ be a partition of the bits b. The subset $b_0$ of bits is said to be free with respect to the constraint $\Psi$ if:

$$\forall b_0 \exists b_1 \Psi(b_0, b_1) \qquad \text{EQUATION (1)}$$

The concept of a partial and total valuation may be defined as follows. A valuation σ is a mapping from Boolean variables to the set {true; false}. A valuation is complete if σ is a total function on the domain vecb of all variables (in $\phi$). A valuation that is not complete is called partial. Given a valuation σ (that assigns either true or false to each Boolean variable in $\phi$) and a formula $\phi$, the value of $\phi$ when evaluated on the valuation σ is denoted by σ($\phi$). If σ is not complete, then σ($\phi$) denotes the formula resulting from replacing each variable b in $\phi$ by the variable's value σ(b). If a is complete, then σ ($\phi$) will be either true or false. Note that the set of free bits need not be unique for a given constraint.

For example, let $\{b_0, b_1\}$ be the universe of Boolean variables. If $\Psi(b_0, b_1)$ is the formula true, then all bits are free. If $\Psi$ is the formula $b_0$=false, then clearly the set $\{b_1\}$ is free. If $\Psi$ is $b_0 \vee b_1$, then free bit finder 224 may pick either bit to be free but not both. For example, $\{b_0\}$ is free since free bit finder 224 may set $b_1$ to true and make $\Psi$:=$b_1$ $\vee$ $b_1$ true. If $\Psi$ is $b_0 \oplus b_1$, then free bit finder 224 may pick either bit to be free, but this time free bit finder 224 may not set the other bit to a fixed constant value. For example, $\{b_0\}$ is again free because free bit finder 224 may set $b_1$ to $b_0 \oplus 1$ to make $\Psi := b_0 \oplus b_1$ true.

Note the two different kinds of fixed bits in the above example. In one kind, the fixed bits were set to specific values, and those value served as "witness" for all valuation choices of the free bits. In the other kind, depending on what choices free bit finder 224 make for the free bits, the fixed bits get set accordingly. The former setting is formalized by the following formula:

$$\exists b_1 \forall b_0 \Psi(b_0, b_1) \qquad \text{EQUATION (2)}$$

This condition in Equation 2 is sufficient for proving that $b_0$ are free because Equation 2 is stronger than Equation 1, that is, Equation 2 implies Equation 1.

A definition of dependently fixed bits and independently fixed bits is discussed in the following. Let $b_0 \cup b_1$ be a partition of the variables in $\Psi$ into fee bits and fixed bits, respectively. A subset $b_{11} \subseteq b_1$ of fixed bits is independently fixed if $$\exists b_{11} \forall b_0 \exists b_{12} \phi \qquad \text{EQUATION (3)}$$

The variables $b_{12} := b_1 - b_{11}$ may be referred to herein as dependently fixed.

In response to determining the free bits of message type M2, free bit finder 224 may encode M1 using the free bits. Free bit finder 224 may completely ignore the constraint of M1 and encode the whole set—both well-formed and non well-formed $M_1$ messages into $M_2$. Free bit finder 224 may be configured to decode similarly to encoding.

Free bit finder 224 may be configured to operate in various phases, such as, but not limited to, a preprocessing phase, a core free bit finder phase, a postprocessing phase, and/or other phases. In the example of FIG. 2, preprocessing module 221 may perform the preprocessing phase, core module 223 may perform the core free bit finder phase, and postprocessing module 225 may perform the postprocessing phase.

An example preprocessing phase is discussed. Free bit finder 224 may solve the Boolean version of the problem. Because the input message types are not Boolean, preprocessing module 221 may convert the input into a Boolean form. More generally, preprocessing module 221 may be tasked with simplifying the free-bit finding problem without introducing any approximating or unsoundness; e.g. from the free-bits of the transformed problem, preprocessing module 221 may infer the free-bits of the original problem. Specifically, preprocessing module 221 may perform the following transformation on the input hierarchical message types: (1) remove the hierarchy in the message type and flatten the message so that the message is easy to read off the bits; (2) remove fixed length arrays from the message type: and (3) remove let expressions and lambda function definitions in the property expressions (constraints).

We note here that there are two kinds of preprocessors: The first kind are those that simplify or transform the free-bit calculation problem without any observable effect. For example, the preprocessor that removes let expressions and lambda-functions is of the first kind. For this kind of pre-processor, free bit finder 224 may not use any transformation to map the free bits of the simplified problem to the free bits of the original problem.

The second kind of preprocessors are those that simplify or transform the problem, but that transform imposes a non-identity encoder-decoder pair. After finding free-bits on the transformed problem, free bit finder 224 may map back to the original problem using the encoder-decoder pair. An example here is the preprocessor that removes fixed-length arrays. Another such example is the preprocessor for flattening the hierarchical message type.

Free bit finder 224 may take a flattened message type that has only primitive elements and find the free variables by finding and removing independently fixed variables. Postprocessing module 225 may map the solution of the transformed problem back into a solution for the original problem. Postprocessing module 225 may generate encoders and decoders for the original message type to-and-from its free bits.

Core module 223 may find free variables in a formula. For example, core module 223 may find independently fixed variables. Let $\phi$ be a constraint over a set b of n Boolean variables. Core module 223 may use a satisfiability (SAT) solver 227 as an oracle. SAT solver 227 may return the following when given a formula $\phi(b)$: (1) an indication that the formula $\phi$ is true and an assignment of values for each variable in $\phi$ (b) that makes the formula $\phi$ true, or (2) an indication that the formula $\phi$ is false.

Core module 223 may perform a procedure, FBF($\phi$, b), that returns a pair ($b_0$, $\sigma$) where $b_0 \subset b$ are the free bits and $\sigma$ is an assignment of values to the other bits $b-b_0$. Core module 223 may iteratively find a certain "important" fixed bit, and set it to a fixed value, and recursively solve the problem that now has one less variable.

A definition of an important bit (e.g., a fixed bit) is discussed in the following. A fixed bit (e.g., a Boolean variable) b is said to be important if there exists two complete valuations, $\sigma_0$ and $\sigma_1$, such that: (a) $\sigma_0(\phi)$=false; (b) $\sigma_1(\phi)$=true; and (c) the valuations $\sigma_0$ and $\sigma_1$ differ only on b; that is $\sigma_0(b')=\sigma_1(b')$ for all b'$\neq$b.

Core module 223 may find important bits, fix them, and recurse as described in the following steps.

1. r:=SAT($\phi$)
2. if r==unsatisfiable, then return (0, ( ))("no free bits"),
3. otherwise let $\sigma_1$ be the satisfying assignment returned by SAT solver 227,
4. r:=SAT(~$\phi$),
5. if r==unsatisfiable, then return (b, < >)) ("all bits are free"),
6. otherwise let $\sigma_0$ be the satisfying assignment returned by SAT solver 227. In this example, $\sigma_0$ makes $\phi$ false and $\sigma_1$ makes $\phi$ true,
7. ($b_1$, $v_1$):=FindImportantBit ($\phi$, $\sigma_0$, $\sigma_1$),
8. Set bit $b_1$ to value $v_1$, in $\phi$, let $\phi'$ denote the resulting formula with n–1 variables,
9. Recursively use the above algorithm to find the free bits ($\phi$: i.e., (b: $\sigma$):=FBF($\phi'$, b–$\{b_1\}$),
10. return (b': $\sigma'$"U ($b_1$->$v_1$)).

If there are n variables, core module 223 may be called n times at most. Core module 223 may use a sub procedure called FindImportantBit. In this example, $\sigma_0$ falsifies $\phi$ and $\sigma_1$ satisfies $\phi$. In this example, $\sigma_0$ maps the variables $b_1, \ldots, b_n$ to values $u_1, \ldots, u_n$. In this example, $\sigma_1$ maps the variables $b_1, \ldots, b_n$ to $v_1, \ldots, v_n$.

Core module 223 may perform the procedure FindImportantBit($\phi$, $\sigma_0$, $\sigma_1$) as follows:

1. iterate over all the bits to find a bit $b_i$ such that $\phi$ flips a truth value when $b_i$ is flipped in $\sigma_0$; For example, ($\phi(u_1, \ldots u_i, \ldots, u_n)$=false, but $\phi$ ($u_1, \ldots -u_i, \ldots, u_n$)=true,
2. if core module 223 finds such a bit bi, then core module 223 may return ($b_i, -u_i, \sigma_{0|b-[bi]}$) because $b_i$ is important;

3. otherwise, core module 223 may iterate over all the bits to find a bit $b_i$ such that $\phi$ flips a truth value when $b_i$ is $\sigma_1$; For example, $(\phi(v_1, \ldots v_i, \ldots, v_n)$=true but $\phi(v_1, \ldots -v_i, \ldots, v_n)$=false;
4. if core module 223 is able to find such a bit $b_j$, core module 223 may return $(b_i, -v_i, \sigma_{1|b-[bi]})$ because $b_i$ is important;
5. otherwise, core module 223 may use a binary search on the path from $\sigma_0$ to $\sigma_1$; to find an important bit as follows: In this example, midpoint $\sigma_2$ is on the path from $\sigma_0$ to $\sigma_1$ on the hypercube.

$$\sigma_2(b) = \begin{cases} \sigma_0(b) & \text{if } \sigma_0(b) = \sigma_1(b) \\ \sigma_0(b) & \text{in half of the cases where } \sigma_0(b) \neq \sigma_1(b) \\ \sigma_0(b) & \text{in other half of the cases where } \sigma_0(b) \neq \sigma_1(b) \end{cases}$$

binary search on $(\sigma_0,\sigma_1)$ is implemented as follows:
if $\sigma_0$ and $\sigma_1$ differ in exactly one position, say $b_i$, then return $(b_i, \sigma_1(b_i), \sigma_1)$
if $\sigma_0$ and $\sigma_1$ differ in more than one position, then let $\sigma_2$ denote some midpoint of $\sigma_1$ and $\sigma_2$
if $\sigma_2(\phi)$=true, then continue binary search on $(\sigma_0, \sigma_2)$
if $\sigma_2(\phi)$=false, then continue binary search on $(\sigma_2, \sigma_1)$ Note that binary search takes at most $\log(n)$ steps, where n is the number of bits, to find one important bit. Note that the third component of the return value of FindImportantBit is a valuation that makes the formula ($\phi$ true even after some important bits have been fixed. Core module 223 may use the valuation that needs a $\sigma_0$ and $\sigma_1$—thus—core module 223 may avoid one SAT call in iterative calls to SAT solver 227. In other words, in the next iterative call, core module 223 may start at Line 4 above because core module 223 may have $\sigma_1$ (e.g., the valuation that makes $\phi$ true).

In a second example, consider two 4-bit integers (ints), A and B, along with the constraint A>B. Now the valuation $\sigma_1$, which can be denoted by (1010, 0110), make the constraint true. Also, the valuation $\sigma_1$, which can be denoted by (1010, 0110), make the constraint false. In this example, core module 223 may compute the midpoint of $\sigma_0$ and $\sigma_1$ as the valuation $\sigma_2$:=(0010, 0110). On $\sigma_2$ the formula $\phi$ is false; therefore a first bit of A is important and core module 223 may fix the first bit to 1. Core module 223 may iterate after having fixed one bit. In this example, core module 223 may compute the midpoint of $\sigma_1$:=(1010, 0110) and $\sigma_0$:=(1010, 1011) to get (1010, 0011), on which ($\phi$ evaluates to true; the first bit of B is important; set to 0).

The free-bit finding algorithm is not guaranteed to return an optimal number of free bits. Depending on the order in which certain bits are fixed, the free-bit finding algorithm may get different solutions. Free bit finder 224 may use heuristics in the FindImportantBit procedure so that it returns certain (fixed) bits before others whenever there is a choice.

The free-bit finding algorithm described above is quite scalable. This is because the free-bit finding algorithm uses a SAT solver 227, which can test satisfiability of very large formulas. Moreover, there is at most one SAT call in each iteration. As such, a number of calls is upper bounded by the total number of variables (e.g., bits) in the original problem. All checks in the binary search procedure for finding the next important bit may evaluate a Boolean formula on a particular valuation.

Note that the free-bit finding algorithm above may be designed to find only independently fixed variables. If a problem does not have any independently fixed variables, then the procedure may find no free variables. As such, free bit finder 224 may be configured to remove constraints that induce dependently fixed variables.

In an example with dependently fixed variables, a message type includes Boolean variables, $b_0, b_1, b_2, \ldots$, along with a well-formedness constraint $(b_0 \oplus b_1 = 0) \wedge \phi)$; that is, the exclusive-or $b_0$ and $b_1$ is false and $\phi$ also holds). This constraint can be handled by declaring that $b_0$ is dependently fixed, in fact $b_0 = b_1$. As such, free bit finder 224 may recursively find free variables in the message that consists of the variables, $b_1, b_2, \ldots$, and the constraint $\phi$ [$b_0$->$b_1$]. Note that $b_0$ is completely eliminated from the problem . . . both from the message (type, and from the constraint.

In accordance with the techniques of the disclosure, core module 223 may generate a first bitstring having, for a first set of bits of the first bitstring, respective first bit values that have a first satisfiability state for requirements of the bitstring format. For example, core module 223 may generate a first bitstring having bits [0, 0, 0, 0] and SAT solver 227 determines that the first bitstring satisfies the protocol format. In this example, core module 223 may generate a second bitstring having, for a second set of bits of the second bitstring, respective second bit values that have a second satisfiability state for the requirements of the bitstring format, the second satisfiability state different than the first satisfiability state. For example, core module 223 may generate a second bitstring having bits [0, 0, 1, 1] and SAT solver 227 determines that the second bitstring does not satisfy the protocol format.

Core module 223 may identify first potential free bits having respective first common values in the first set of bits and in the second bits. For example, core module 223 may identify first potential free bits to be the first two bits of the four-bit bitstring (e.g., [0, 0]).

Core module 223 may generate a third bitstring having, for a third set of bits of the third bitstring, the first potential free bits with the respective first common values and third remaining bits, the third set of bits having respective third bit values that have the second satisfiability state for the requirements of the bitstring format. For example, core module 223 may generate a third bitstring having bits [0, 0, 0, 1] and SAT solver 227 determines that the third bitstring does not satisfy the protocol format.

Core module 223 may identify second potential free bits in the first set of bits and in the third set of bits having respective second common values. For example, core module 223 may identify second potential free bits to be the first three bits of the four-bit bitstring (e.g., [0, 0, 0]). Core module 223 may identify a fixed bit that is not included in the first potential free bits and is not included in the second potential free bits. For example, core module 223 may identify the last bit of the four-bit bitstring as a fixed bit. Core module 223 may output an indication of the fixed bit and a fixed bit value of the fixed bit, the fixed bit value being a corresponding value for the fixed bit that satisfies the requirements of the bitstring format. For example, core module 223 may output, to nodes 110 of FIG. 1, an indication of the fixed bit (e.g., a mask [0, 0, 0, 1]) and a fixed bit value of the fixed bit (e.g., '1') that satisfies the requirements of a protocol format. While the foregoing example uses 4 bits other examples may use more than 4 bits. Moreover, while the example of FIG. 2 used a protocol format other bitstring formats may be used, for example, core module 223 may be configured to identify fixed bits and/or free bits for one or more storage rules for a storage system.

Techniques described herein may help to improve a computational efficiency of computing device 200 compared to systems that that analyze each combination of bits in the bitstring. For example, a system that identifies free bits by analyzing each combination of bits in the bitstring would use a processing effort corresponding to a time complexity of N*N for bit strings having 'N' number of bits. In contrast, techniques described herein for identifying fixed bits of a bitstring format may enable computing device 200 to identify free bits that use a processing effort corresponding to a time complexity of N*log(N), which is a significant reduction in computational effort.

Additionally, techniques described herein may help to allow nodes 110 of FIG. 1, which may be each configured for different protocols to communicate. For example, rather than relying on configuring each node of nodes 110 with a particular protocol or relying on configuring each node of nodes 110 with all of the protocols used by nodes 110 to allow communication between each of node of nodes 110, techniques described herein may configure each node of nodes 110 to communicate using one or more free bits identified by computing device 200 that satisfy a bitstring format for nodes 110. In this way, techniques described herein may help to configure computing device 200 to automatically construct transcoders that enable transmission of data over protocol sessions 111 of FIG. 1, which may improve a data throughput of communications between nodes 110.

Techniques described herein may help to allow a higher data compression rate of a communication channel. For example, nodes 110 of FIG. 1 may be configured to add additional information for transmission on protocol sessions 111 of FIG. 1 to an original message using one or more free bits identified by computing device 200. In this way, techniques described herein may help to "compress" data on a communication channel, which may improve a data throughput of system 100 of FIG. 1.

Figure 3:
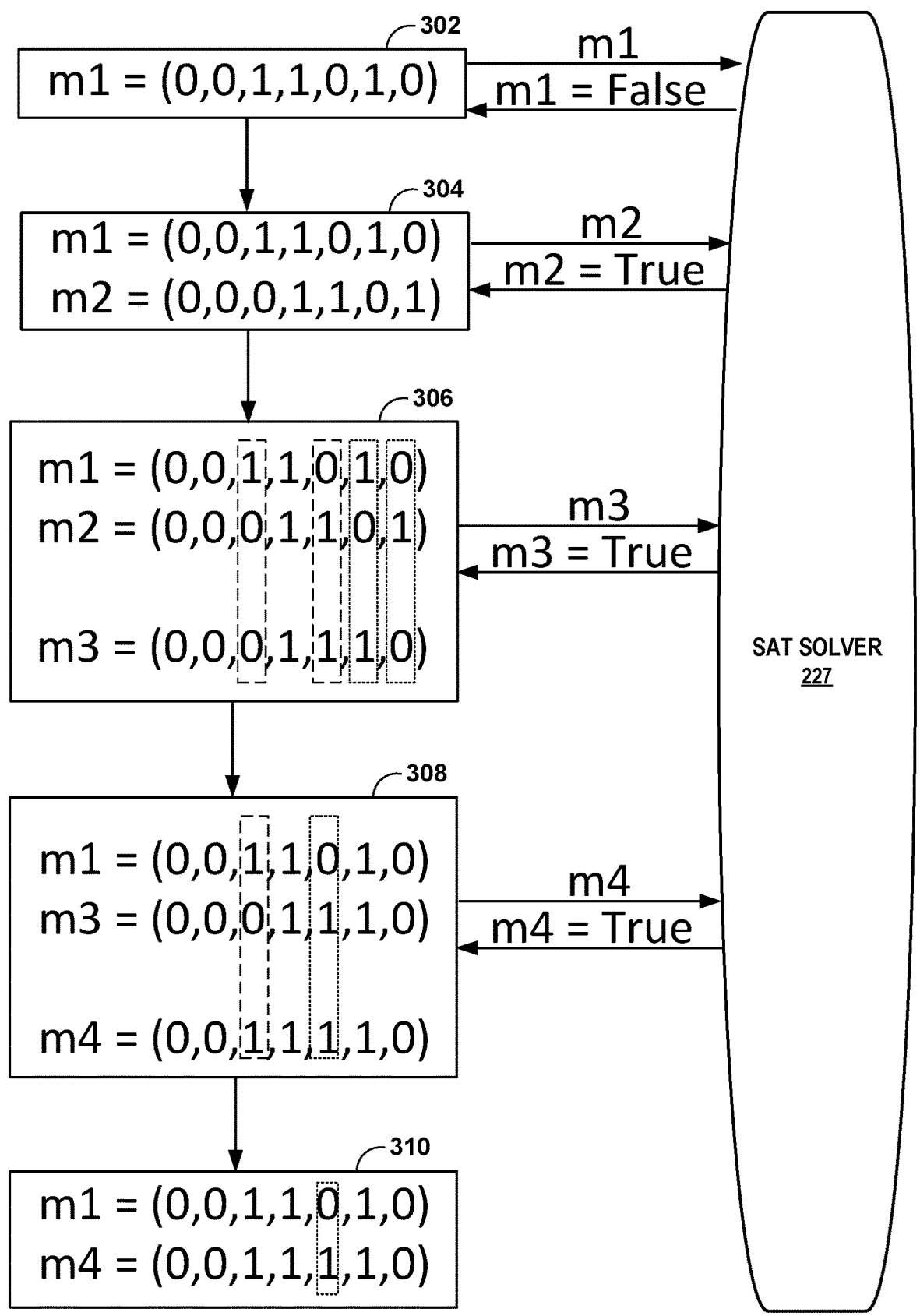
FIG. 3 is a block diagram illustrating an example process of a computing system for identifying fixed bits of a bitstring format, in accordance with the techniques of the disclosure.

FIG. 3 is a block diagram illustrating an example process of a computing system for identifying fixed bits of a bitstring format, in accordance with the techniques of the disclosure. FIG. 3 refers to FIGS. 1-2 for example purposes only. In the example of FIG. 3, a bitstring is sparse. For example, core module 223 may find Find U such that $\phi_{explain}$ (V)=$\phi_{explain}$ (U) where |U|>>|V| and $\phi_{explain}$ is sparse.

Core module 223 may generate a first bitstring ("m1") having, for a first set of bits of the first bitstring, respective first bit values that have a first satisfiability state for the requirements of the bitstring format (302). In this example, core module 223 may determine that the first string has the first satisfiability state for requirements of the bitstring format. For example, core module 223 may output the first bitstring having bits [0, 0, 1, 1, 0, 1, 0] to SAT solver 227. In this example, SAT solver 227 determines that the first bit values of the first bitstring have the first satisfiability state for requirements of the bitstring format and SAT solver 227 outputs an indication that the first bitstring does not satisfy the bitstring format (e.g., m1=False). In this example, the first satisfiability state is False: does not satisfy.

Core module 223 may generate a second bitstring ("m2") having, for a second set of bits of the second bitstring, respective second bit values that have a second satisfiability state for the requirements of the bitstring format, the second satisfiability state different than the first satisfiability state (304). For example, core module 223 may output the second bitstring having bits [0, 0, 0, 1, 1, 0, 1] to SAT solver 227. In this example, SAT solver 227 determines that the respective second bit values of the second bitstring have the second satisfiability state for requirements of the bitstring format and SAT solver 227 outputs an indication that the second bitstring satisfies the bitstring format (e.g., m2=True). In this example, the first satisfiability state is True: does satisfy. In some examples, core module 223 may generate different second bitstrings until SAT solver 227 determines that the second bitstring has a satisfiability state different from the first bitstring. For instance, core module 223 may generate different second bitstrings until SAT solver 227 determines that the second bitstring has a satisfiability state of false when the first bitstring has a satisfiability state of true. In some instances, core module 223 may generate different second bitstrings until SAT solver 227 determines that the second bitstring has a satisfiability state of true when the first bitstring has a satisfiability state of false. Examples of a SAT solver may include, for example, YICES™, Z3™ or another SAT solver. Examples of YICES™ may be found in U.S. Pat. No. 7,653,520.

Core module 223 may identify first potential free bits having respective first common values in the first set of bits and in the second set of bits (306). For example, core module 223 may identify first potential free bits to be the first bit, the second bit, and the fourth bit (e.g., 0, 0, X, 1, X, X, X) where 'X' indicates bits that are not first potential free bits. Core module 223 may generate a third bitstring ("m3") having, for a third set of bits of the third bitstring, the first potential free bits with the respective first common values and third remaining bits, the third set of bits having respective third bit values that have the second satisfiability state for the requirements of the bitstring format. For example, core module 223 may determine a Hamming distance between the first bitstring and the second bitstring. In this example, core module 223 may perform a binary search over a measure of distance (e.g., the Hamming distance). For instance, core module 223 may set half of the third remaining bits to values of the second bitstring (illustrated in FIG. 3 with dashed lines) and set half of the third remaining bits to values of the first bitstring (illustrated in FIG. 3 with dotted lines). In some examples, core module 223 may generate the third bitstring by randomly selecting each bit value over a measure of distance (e.g., the Hamming distance) to values of the first bitstring and the second bitstring. Core module 223 may output the third bitstring having bits [0, 0, 0, 1, 1, 1, 0]. In this example, SAT solver 227 determines that the respective third bit values of the third bitstring have the second satisfiability state for requirements of the bitstring format and SAT solver 227 may output an indication that the third bitstring satisfies the protocol format (e.g., m3=True). As shown, the Hamming distance between the first bitstring and the second bitstring is 4 and the Hamming distance between the first bitstring and the third bitstring in this example is 2.

While examples described herein use a Hamming distance, core module 223 may determine any measure of distance between the first bitstring and the second bitstring. For example, core module 223 may be configured to use distance metrics that are either normalized versions of Hamming distance (e.g., hamming distance divided by total bitstring length, or other forms of normalization) or some other distance metric. The distance metrics may not be local, in the sense of the distance metric may be a sum of measures of distance in each bit (which is true of the Hamming distance). In some examples, core module 223 may be configured to use a Levenshtein distance, which is a measure of edit distance that includes single-character insertion, deletion, and substitution edit actions. Core module 223 may be configured to use a Jaro-Winkler distance, which is a measure of edit distance, where edits can include transpositions as well as substitutions. Core module 223 may be configured to use a Jaccard index or a simple matching coefficient, which in the case of bitstrings could be interpreted as a normalized version of Hamming distance, with various methods of normalization.

Core module 223 may identify second potential free bits in the first set of bits and in the third set of bits having respective second common values (308). For example, core module 223 may identify the second potential free bits to be the first bit, the second bit, and the fourth bit (e.g., 0, 0, X, 1, X, 1, 0) where 'X' indicates bits that are not second potential free bits. Core module 223 may generate a fourth bitstring ("m4") having, for a fourth set of bits of the fourth bitstring, the second potential free bits with the respective second common values and fourth remaining bits, the fourth set of bits having respective fourth bit values that have the second satisfiability state for the requirements of the bitstring format. For example, core module 223 may perform a binary search over a Hamming distance and set half (e.g., 1) of the fourth remaining bits to values of the first bitstring (illustrated in FIG. 3 with dashed lines) and set half (e.g., 1) of the fourth remaining bits to values of the third bitstring (illustrated in FIG. 3 with dotted lines). In some examples, core module 223 may generate the fourth bitstring by randomly assigning bit values of the fourth remaining bits to values of the first bitstring and the third bitstring. Core module 223 may output the fourth bitstring having bits [0, 0, 1, 1, 1, 1, 0]. In this example, SAT solver 227 determines that the respective fourth bit values of the fourth bitstring have the second satisfiability state for requirements of the bitstring format and SAT solver 227 may output an indication that the fourth bitstring satisfies the protocol format (e.g., m4=True). As shown, the Hamming distance between the first bitstring and fourth bitstring is 1 in this example.

Core module 223 may identify third potential free bits in the first set of bits and in the fourth set of bits having respective third common values when the fourth set of bits have respective fourth bit values that have the second satisfiability state (e.g., m4=True) for requirements of the bitstring format (310). For example, core module 223 may identify the third potential free bits to be the first bit, the second bit, the third bit, the fourth bit, the sixth bit, and the seventh bit (e.g., 0, 0, 1, 1, X, 1, 0) where 'X' indicates bits that are not third potential free bits. In some examples, core module 223 may identify third potential free bits in the third set of bits and in the fourth set of bits having respective third common values when the fourth set of bits have respective fourth bit values that have the first satisfiability state (e.g., m4=False) for requirements of the bitstring format.

Core module 223 may identify a fixed bit that is not included in the first potential free bits, is not included in the second potential free bits, and is not included in the third potential free bits. For example, core module 223 may identify the fifth bit as a fixed bit (e.g., relevant). Core module 223 may output, to nodes 110 of FIG. 1, an indication of the fixed bit (e.g., a mask [0, 0, 0, 0, 1, 0, 0]) and a fixed bit value of the fixed bit (e.g., '1') that satisfies the requirements of a protocol format. While the foregoing example uses seven bits other examples may use more than 7 bits or fewer than 7 bits. Moreover, while the example of FIG. 4 used a protocol format other bitstring formats may be used, for example, core module 223 may be configured to identify fixed bits and/or free bits for of one or more storage rules for a storage system.

In the example of FIG. 3, core module 223 may perform a first step that, for each assignment to relevant variables (e.g., fixed bit, important bit, etc.) has a complexity of $2|U|$, a second step for random samples until SAT solver 273 differs in satisfiability state having a complexity of $\ln(1/1-\kappa))$, and a third step for a binary search of a Hamming distance having a complexity of $\ln(|V|)$, where core module 223 may find relevant variables of φ(explain) with confidence κ in $2^{|U|}\ln(|V|/(1-\kappa))$. For example, core module 223 may determine a confidence (e.g., κ) of a free bit of the first potential free bits in the first set of bits is not a fixed bit and output an indication of the free bit in response to determining the confidence satisfies a threshold. The threshold may be configurable. For example, the threshold may be set to 1 (e.g., 100%) or less than 1 (e.g., 90%, 80%, etc.)

Nodes 110 of FIG. 1 may use the indication of the free bit generated by free bit finder 224. For example, nodes 110 may generate or store data. In response to receiving the indication of the free bit value from free bit finder 224, nodes 110 may generate one or more bitstrings to have the free bit value indicate at least a portion of the data. For example, nodes 110 may repurpose the fifth bit of the bitstring in the example of FIG. 3 to indicate at least the portion of data for output by nodes 110. For example, node 110B may exchange at least the portion of data with node 110A using first protocol messages that conform to a first bitstring format for a first protocol. In this example, the first bitstring format may have one or more first fixed bits with respective bit values required to satisfy requirements of the first protocol and also have one or more first free bits. SAT solver 227 may be configured to determine a bitstring satisfies a protocol format based on the bitstring satisfying the first protocol.

In this example, Node 110N may exchange data with node 110B using second protocol messages that conform to a second bitstring format for a second protocol. In this example, the second bitstring format has one or more second fixed bits with respective bit values required to satisfy requirements of the second protocol and also has one or more second free bits. SAT solver 227 may be configured to determine a bitstring satisfies a protocol format based on the bitstring satisfying the second protocol. For example, SAT solver 227 may be configured to determine a bitstring satisfies a protocol format in response to determining that the bitstring satisfies both the first protocol and the second protocol.

Node 110B may receive a received message of the first protocol messages, the received message comprising a first bitstring having first bit values for the one or more first free bits of the first bitstring. In this example, node 110B may generate a generated message of the second protocol messages, the generated message comprising a second bitstring having at least some of the first bit values from the received message as bit values of the one or more second free bits for the second bitstring. In this way, nodes 110 may be compliant with various protocols and/or storage rules while repurposing free bits.

Figure 4:
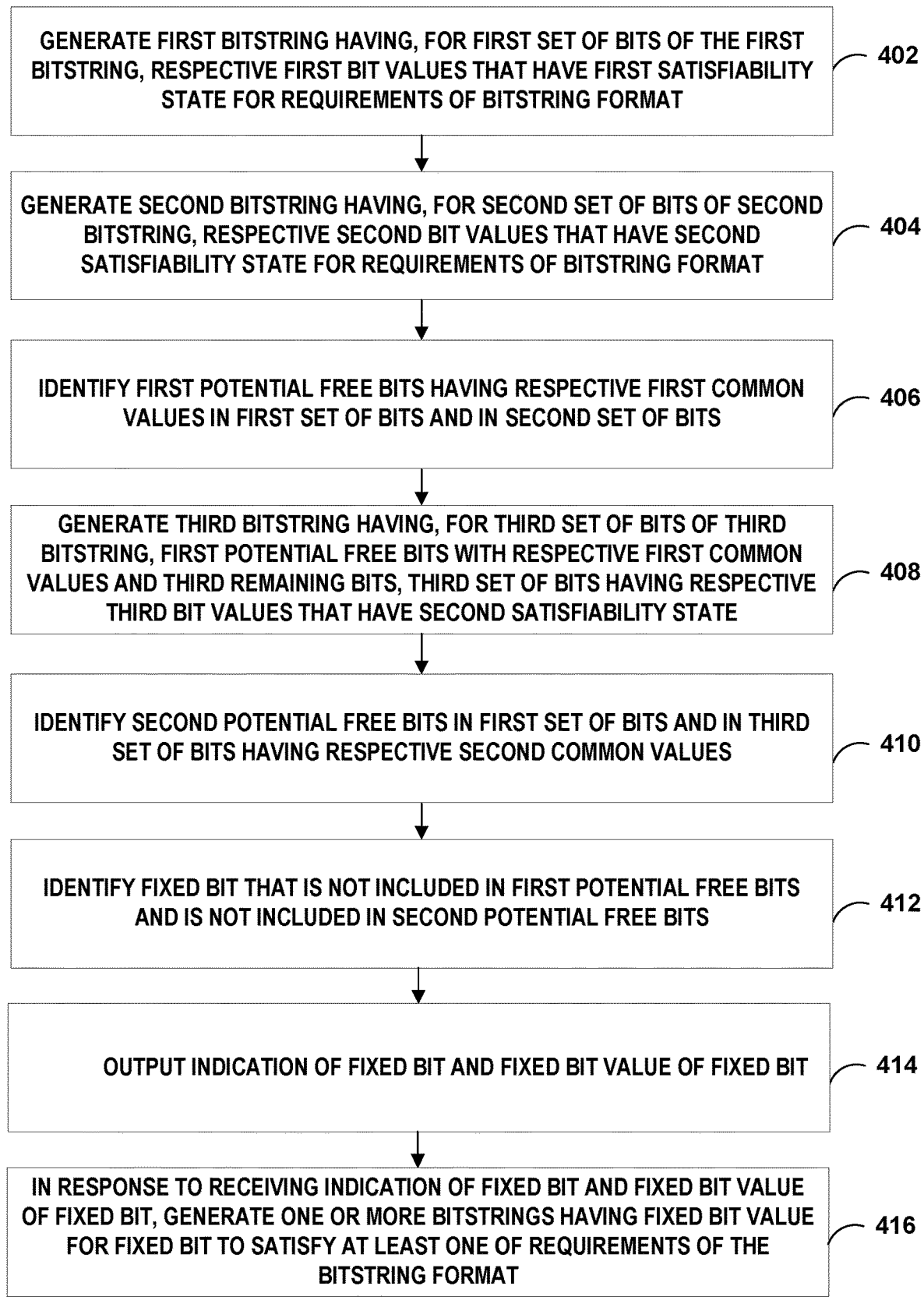
FIG. 4 is a flow chart illustrating an example operation in accordance with the techniques of the disclosure.

FIG. 4 is a flow chart illustrating an example operation in accordance with the techniques of the disclosure. FIG. 4 is described with respect to FIGS. 1-3 for example purposes only. Free bit finder 102 may generate a first bitstring having, for a first set of bits of the first bitstring, respective first bit values that have a first satisfiability state for requirements of the bitstring format (402). Free bit finder 102 may generate a second bitstring having, for a second set of bits of the second bitstring, respective second bit values that have a second satisfiability state for the requirements of the bitstring format, the second satisfiability state different than the first satisfiability state (404). Free bit finder 102 may identify first potential free bits having respective first common values in the first set of bits and in the second set of bits (406). Free bit finder 102 may generate a third bitstring having, for a third set of bits of the third bitstring, the first potential free bits with the respective first common values and third remaining bits, the third set of bits having respective third bit values that have the second satisfiability state for the requirements of the bitstring format (408). Free bit finder 102 may identify second potential free bits in the first set of bits and in the third set of bits having respective second common values (410). Free bit finder 102 may identify a fixed bit that is not included in the first potential free bits and is not included in the second potential free bits (412). Free bit finder 102 may output an indication of the fixed bit and a fixed bit value of the fixed bit, the fixed bit value being a corresponding value for the fixed bit that satisfies the requirements of the bitstring format (414). In response to receiving the indication of the fixed bit and fixed bit value of the fixed bit, nodes 110 may generate one or more bitstrings having the fixed bit value for the fixed bit to satisfy at least one of the requirements of the bitstring format (416).

Figure 5:
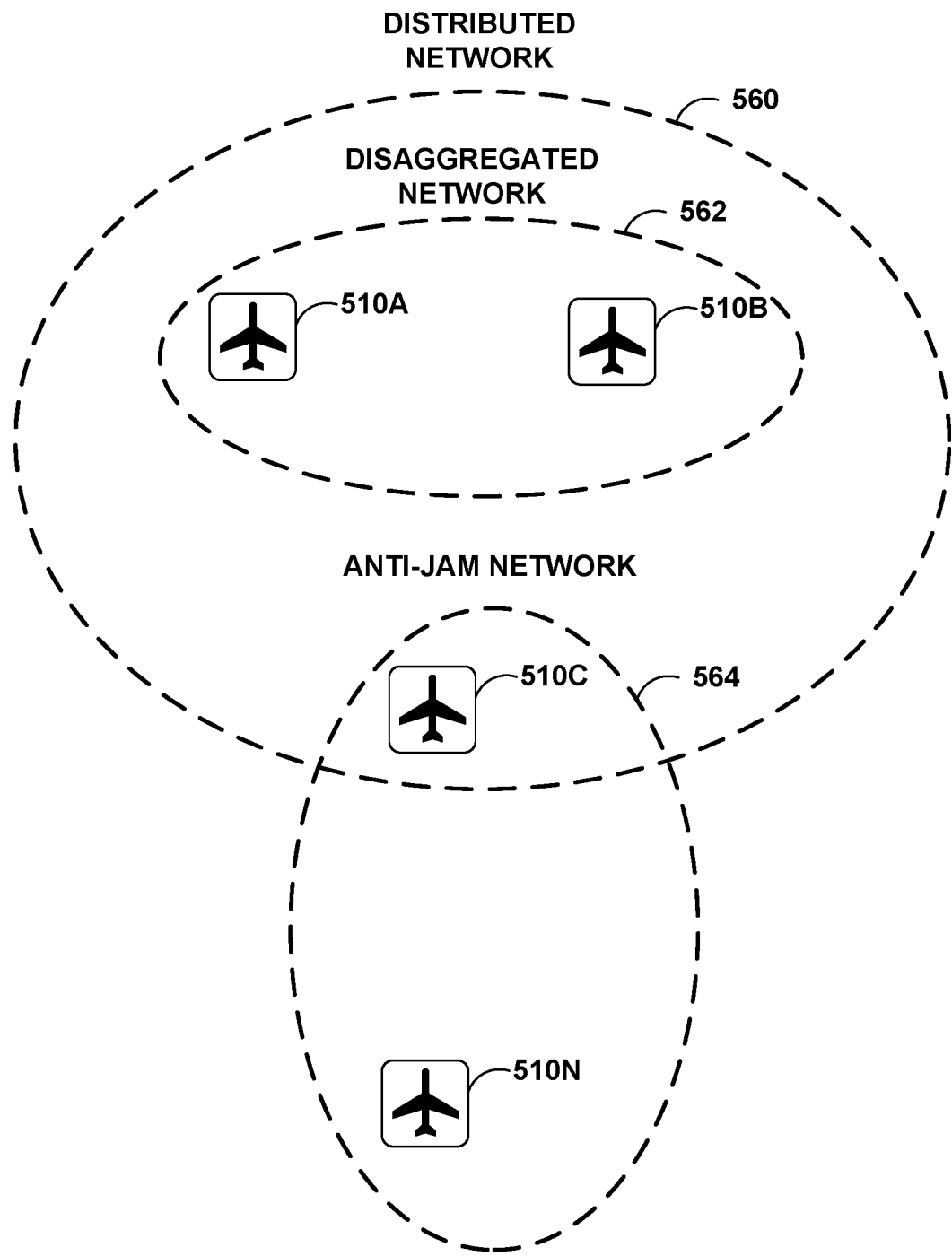
FIG. 5 is a conceptual diagram illustrating a first example use case in accordance with the techniques of the disclosure.

FIG. 5 is a conceptual diagram illustrating a first example use case in accordance with the techniques of the disclosure. FIG. 5 is described with respect to FIGS. 1-4 for example purposes only. In this example, airplane 510A may exchange, via distributed network 560, data with airplanes 510B, 510C using first protocol messages that conform to a first bitstring format for a first protocol. In this example, airplane 510A may exchange, via disaggregated network 562, data with airplane 510B using second protocol messages that conform to a second bitstring format for a second protocol. Airplane 510C may exchange, via anti jam network 564, data with airplane 510N using third protocol messages that conform to a third bitstring format for a third protocol.

Rather than configuring airplanes 510A-510N (collectively, "airplanes 510") with a single protocol (e.g., only the first protocol) or configuring each of airplanes 510 to support all protocols used by airplanes 510 (e.g., the first protocol, the second protocol, and the third protocol), airplanes 510 may be configured to use free bits. For example, free bit finder 102 may output an indication of a fixed bit and a fixed bit value of the fixed bit, the fixed bit value being a corresponding value for the fixed bit that satisfies requirements of the first bitstring format for distributed network 560, the second bitstring format for disaggregated network 562, and the third bitstring format for anti-jam network 564. In response to receiving the indication of the fixed bit and fixed bit value of the fixed bit, airplanes 510 may generate one or more bitstrings having the fixed bit value for the fixed bit and also one or more free bits. For example, airplane 510A may use the one or more free bits to output, via airplane 510C, data to airplane 510N. In this way, airplanes 510 may exchange data using one or more free bits.

Techniques described herein may help to allow airplanes 510, which may be each configured for different protocols to communicate. For example, rather than relying on configuring each airplane of airplanes 510 with a particular protocol or relying on configuring each airplane of airplanes 510 with all of the protocols used by airplanes 510 to allow communication between each airplane of airplanes 510, techniques described herein may configure each airplane of airplanes 510 to communicate using one or more free bits identified by processing circuitry 104 that satisfy a bitstring format for airplanes 510. In this way, techniques described herein may help to automatically construct transcoders that enable transmission of data over networks 560-564, which may improve a data throughput of networks 560-564.

Figure 6:
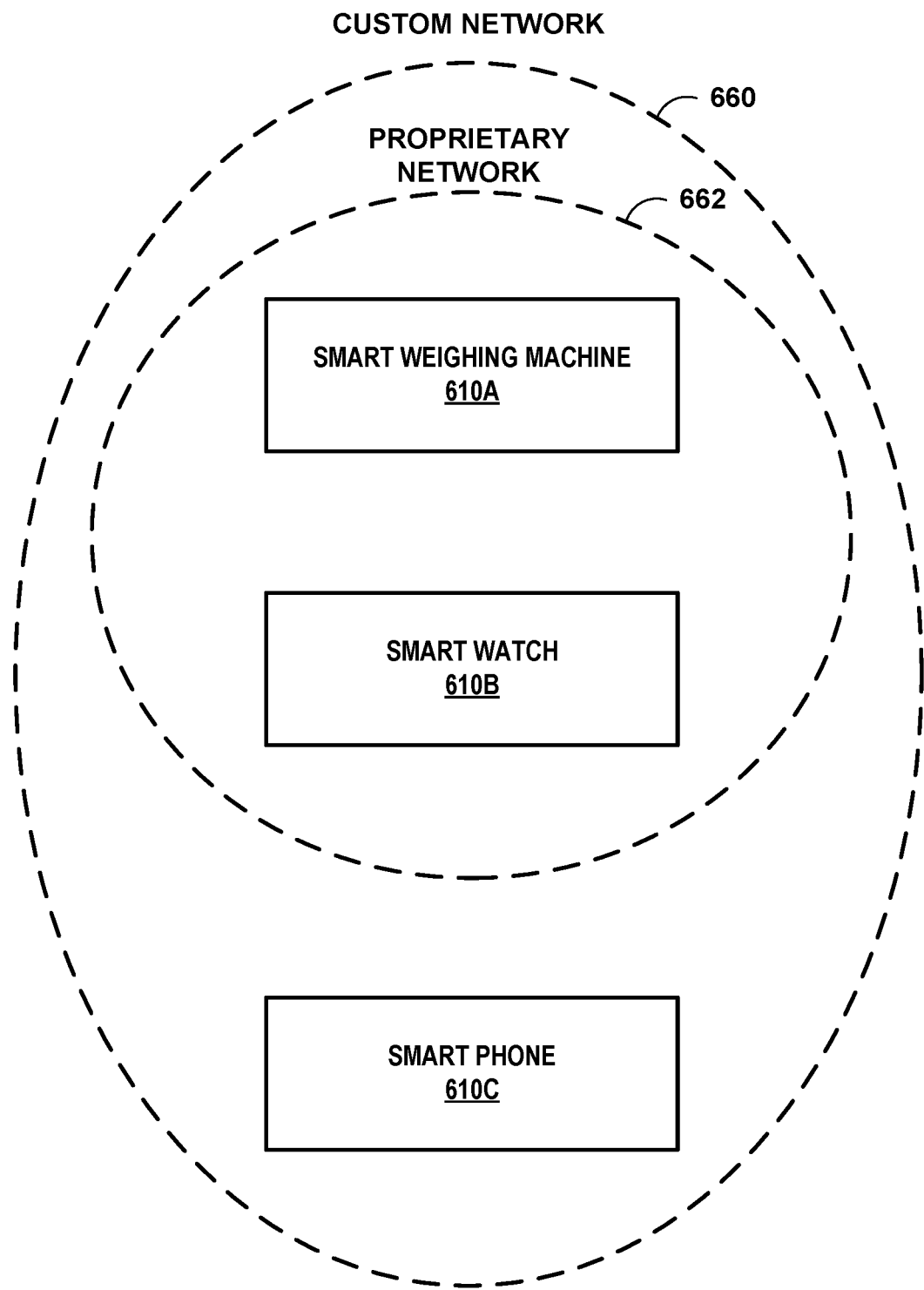
FIG. 6 is a conceptual diagram illustrating a second example use case in accordance with the techniques of the disclosure.

FIG. 6 is a conceptual diagram illustrating a second example use case in accordance with the techniques of the disclosure. FIG. 6 is described with respect to FIGS. 1-5 for example purposes only. In this example, smart phone 610C may exchange, via custom network 660, data with smart weighing machine 610A and smart watch 610B using first protocol messages that conform to a first bitstring format for a first protocol. In this example, smart weighing machine 610A may exchange, via proprietary network 662, data with smart watch 610B using second protocol messages that conform to a second bitstring format for a second protocol.

Rather than configuring smart weighing machine 610A, smart watch 610B, and smart phone 610C with a single protocol (e.g., only the first protocol or only the second protocol) or configuring each of smart weighing machine 610A, smart watch 610B, and smart phone 610C to support all protocols used (e.g., the first protocol and the second protocol), smart weighing machine 610A, smart watch 610B, and smart phone 610C may be configured to use free bits. For example, free bit finder 102 may output an indication of a fixed bit and a fixed bit value of the fixed bit, the fixed bit value being a corresponding value for the fixed bit that satisfies requirements of the first bitstring format for custom network 660 and the second bitstring format for proprietary network 662. In response to receiving the indication of the fixed bit and fixed bit value of the fixed bit, smart weighing machine 610A, smart watch 610B, and smart phone 610C may generate one or more bitstrings having the fixed bit value for the fixed bit and also one or more free bits. For example, smart weighing machine 610A may use the one or more free bits to output, via smart phone 610C, data to smart watch 610B. For instance, smart weighing machine 610A may output, via smart phone 610C, a bit string of free bits to smart watch 610B. In this way, smart weighing machine 610A, smart watch 610B, and smart phone 610C may exchange data using one or more free bits.

Techniques described herein may help to allow smart weighing machine 610A, smart watch 610B, and smart phone 610C, which may be each configured for different protocols to communicate. For example, rather than relying on configuring each one of smart weighing machine 610A, smart watch 610B, and smart phone 610C with a particular protocol or relying on configuring each one of smart weighing machine 610A, smart watch 610B, and smart phone 610C with all of the protocols used by smart weighing machine 610A, smart watch 610B, and smart phone 610C to allow communication between each one of smart weighing machine 610A, smart watch 610B, and smart phone 610C, techniques described herein may configure each one of smart weighing machine 610A, smart watch 610B, and smart phone 610C to communicate using one or more free bits identified by processing circuitry 104 that satisfy a bitstring format for smart weighing machine 610A, smart watch 610B, and smart phone 610C. In this way, techniques described herein may help to automatically construct transcoders that enable transmission of data over networks 660-662, which may improve a data throughput of networks 660-662.

Figure 7:
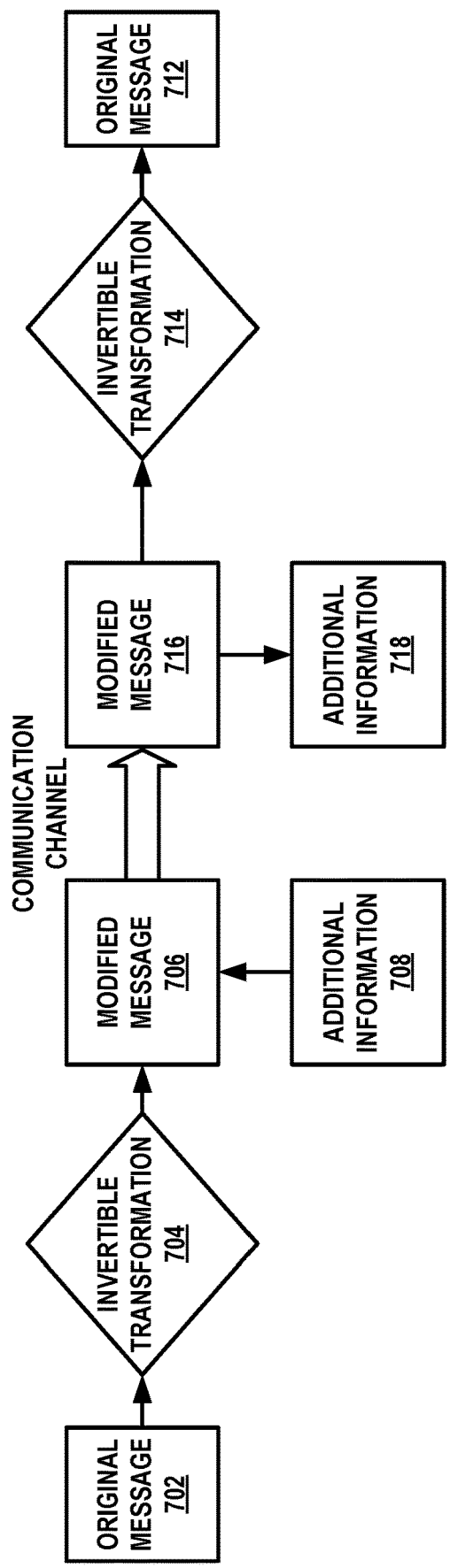
FIG. 7 is a conceptual diagram illustrating a third example use case in accordance with the techniques of the disclosure.

FIG. 7 is a conceptual diagram illustrating a third example use case in accordance with the techniques of the disclosure. FIG. 7 is described with respect to FIGS. 1-6 for example purposes only. In the example of FIG. 7, nodes 110 of FIG. 1 may be configured to use free bit finder 102 of FIG. 1 as a protocol-level compression technique. For example, free bit finder 102 may help to reduce a total number of bits sent on a communication channel, in order to communicate an original message 702.

In the example of FIG. 7, nodes 110 of FIG. 1 may be configured to use free-bit finder 102 of FIG. 1 in a multi-stage setting, where data is transformed in an invertible transformation (e.g., invertible transform 704 and/or invertible transform 714). For example, node 110A may apply invertible transformation 704 to original message 702. In this example, node 110A may be configured to apply free-bit finder 102 to determine one or more free bits. Node 110A may add additional information 708 to the one or more free bits of the result of invertible transformation 704 to generate modified message 706 and transmit modified message 706 to node 110B. For instance, node 110A may set the one or more free bits to correspond to values of additional information 708.

Node 110B of FIG. 1 may be configured to receive a modified message 716, which may be identical to modified message 706, from node 110A and receive an indication of the one or more free bits from free bit finder 102 of FIG. 1. In this example, node 110B may determine additional information 718 from the one or more free bits of modified message 716. Node 110B may apply invertible transformation 714 to modified message 716 to generate original message 712. In this way, additional information 708 may be "mixed in" with the original message 702 to generate modified message 706, that goes through the communication channel. In this example, node 110B may separate modified message 716 to generate original message 712 (using invertible transformation 714) and additional information 718.

Techniques described herein may help to allow a higher data compression rate of a communication channel. For example, system 100 of FIG. 1 may be configured to add additional information for transmission on the communication channel to an original message. In this way, techniques described herein may help to "compress" data on a communication channel, which may improve a data throughput of system 100.

The speed of the free-bit-finder process (e.g., a free-bit-finder algorithm) described herein may enable "real-time" analysis and use of a communication channel, where even protocols that were not known at compile/build time of the system, could be analyzed or re-analyzed during run time to (re) plan marshalling and unmarshalling of information on a communication channel that changes during runtime.

The techniques described in this disclosure may be implemented, at least in part, in hardware, software, firmware or any combination thereof. For example, various aspects of the described techniques may be implemented within one or more processors, including one or more microprocessors, digital signal processors (DSPs), application specific integrated circuits (ASICs), field programmable gate arrays (FPGAs), or any other equivalent integrated or discrete logic circuitry, as well as any combinations of such components. The term "processor" or "processing circuitry" may generally refer to any of the foregoing logic circuitry, alone or in combination with other logic circuitry, or any other equivalent circuitry. A control unit comprising hardware may also perform one or more of the techniques of this disclosure.

Such hardware, software, and firmware may be implemented within the same device or within separate devices to support the various operations and functions described in this disclosure. In addition, any of the described units, modules or components may be implemented together or separately as discrete but interoperable logic devices. Depiction of different features as modules or units is intended to highlight different functional aspects and does not necessarily imply that such modules or units must be realized by separate hardware or software components. Rather, functionality associated with one or more modules or units may be performed by separate hardware or software components, or integrated within common or separate hardware or software components.

The techniques described in this disclosure may also be embodied or encoded in a computer-readable medium, such as a non-transitory computer-readable storage medium, containing instructions. Instructions embedded or encoded in a computer-readable storage medium may cause a programmable processor, or other processor, to perform the method, e.g., when the instructions are executed. Computer readable storage media may include random access memory (RAM), read only memory (ROM), programmable read only memory (PROM), erasable programmable read only memory (EPROM), electronically erasable programmable read only memory (EEPROM), flash memory, a hard disk, a CD-ROM, a floppy disk, a cassette, magnetic media, optical media, or other computer readable media.

What is claimed is:

1. A system for identifying fixed bits of a bitstring format, the system comprising:
   one or more processors implemented in circuitry and configured to:
      generate a first bitstring having, for a first set of bits of the first bitstring, respective first bit values that have a first satisfiability state for requirements of the bitstring format;
      generate a second bitstring having, for a second set of bits of the second bitstring, respective second bit values that have a second satisfiability state for the requirements of the bitstring format, the second satisfiability state different than the first satisfiability state;
      identify first potential free bits having respective first common values in the first set of bits and in the second set of bits;
      generate a third bitstring having, for a third set of bits of the third bitstring, the first potential free bits with the respective first common values and third remaining bits, the third set of bits having respective third bit values that have the second satisfiability state for the requirements of the bitstring format;
      identify second potential free bits in the first set of bits and in the third set of bits having respective second common values;
      identify a fixed bit that is not included in the first potential free bits and is not included in the second potential free bits;
      output an indication of the fixed bit and a fixed bit value of the fixed bit, the fixed bit value being a corresponding value for the fixed bit that satisfies the requirements of the bitstring format; and
   a plurality of nodes implemented in circuitry, wherein each node of the plurality of nodes is configured to:
      in response to receiving the indication of the fixed bit and fixed bit value of the fixed bit, generate one or more bitstrings having the fixed bit value for the fixed bit to satisfy at least one of the requirements of the bitstring format.

2. The system of claim 1, wherein the one or more processors are configured to:
   generate a fourth bitstring having, for a fourth set of bits of the fourth bitstring, the second potential free bits with the respective second common values and fourth remaining bits,
   when the fourth set of bits have respective fourth bit values that have the second satisfiability state for requirements of the bitstring format, identify third potential free bits in the first set of bits and in the fourth set of bits having respective third common values;

when the fourth set of bits have respective fourth bit values that have the first satisfiability state for requirements of the bitstring format, identify the third potential free bits in the third set of bits and in the fourth set of bits having respective fourth common values, and wherein to identify the fixed bit that is not included in the first potential free bits and is not included in the second potential free bits, the one or more processors are configured to further identify the fixed bit to be not included in the third potential free bits.

3. The system of claim 1, wherein, to generate the third bitstring, the one or more processors are configured to:
determine a Hamming distance between the first bitstring and the second bitstring.

4. The system of claim 1, wherein, to generate the third bitstring, the one or more processors are configured to:
apply a binary search over a measure of distance; or
randomly select each bit value over the measure of distance.

5. The system of claim 1, wherein the bitstring format comprises one or more of a protocol format or one or more storage rules for a storage system.

6. The system of claim 1, further comprising a satisfiability solver implemented in circuitry and configured to:
determine that the respective first bit values have the first satisfiability state for requirements of the bitstring format;
determine that the respective second bit values have the second satisfiability state for requirements of the bitstring format; and
determine that the respective third bit values have the second satisfiability state for requirements of the bitstring format.

7. The system of claim 1, wherein the one or more processors are configured to:
determine a confidence of a free bit of the first potential free bits in the first set of bits is not a fixed bit; and
output an indication of the free bit in response to determining that the confidence satisfies a threshold.

8. The system of claim 7, wherein a node of the plurality of nodes is configured to:
generate or store data; and
in response to receiving the indication of the free bit from the one or more processors, generate the one or more bitstrings to have a free bit value for the free bit set to indicate at least a portion of the data.

9. The system of claim 1, wherein the plurality of nodes comprises:
a first node;
a second node that exchanges data with the first node using first protocol messages that conform to a first bitstring format for a first protocol, the first bitstring format having one or more first fixed bits with respective bit values required to satisfy requirements of the first protocol and also having one or more first free bits; and
a third node that exchanges data with the second node using second protocol messages that conform to a second bitstring format for a second protocol, the second bitstring format having one or more second fixed bits with respective bit values required to satisfy requirements of the second protocol and also having one or more second free bits.

10. The system of claim 9,
wherein the second node receives a received message of the first protocol messages, the received message comprising a first bitstring having first bit values for the one or more first free bits of the first bitstring, and
wherein the second node generates a generated message of the second protocol messages, the generated message comprising a second bitstring having at least some of the first bit values from the received message as bit values of the one or more second free bits for the second bitstring.

11. A method for identifying fixed bits of a bitstring format, the method performed by a computing system and comprising:
generating a first bitstring having, for a first set of bits of the first bitstring, respective first bit values that have a first satisfiability state for requirements of the bitstring format;
generating a second bitstring having, for a second set of bits of the second bitstring, respective second bit values that have a second satisfiability state for the requirements of the bitstring format, the second satisfiability state different than the first satisfiability state;
identifying first potential free bits having respective first common values in the first set of bits and in the second set of bits;
generating a third bitstring having, for a third set of bits of the third bitstring, the first potential free bits with the respective first common values and third remaining bits, the third set of bits having respective third bit values that have the second satisfiability state for the requirements of the bitstring format;
identifying second potential free bits in the first set of bits and in the third set of bits having respective second common values;
identifying a fixed bit that is not included in the first potential free bits and is not included in the second potential free bits; and
outputting an indication of the fixed bit and a fixed bit value of the fixed bit, the fixed bit value being a corresponding value for the fixed bit that satisfies the requirements of the bitstring format.

12. The method of claim 11, further comprising:
generating a fourth bitstring having, for a fourth set of bits of the fourth bitstring, the second potential free bits with the respective second common values and fourth remaining bits,
when the fourth set of bits have respective fourth bit values that have the second satisfiability state for requirements of the bitstring format, identifying third potential free bits in the first set of bits and in the fourth set of bits having respective third common values;
when the fourth set of bits have respective fourth bit values that have the first satisfiability state for requirements of the bitstring format, identifying the third potential free bits in the third set of bits and in the fourth set of bits having respective fourth common values, and
wherein identifying the fixed bit that is not included in the first potential free bits and is not included in the second potential free bits comprises further identifying the fixed bit to be not included in the third potential free bits.

13. The method of claim 11, wherein generating the third bitstring comprises:
determining a Hamming distance between the first bitstring and the second bitstring.

14. The method of claim 11, wherein generating the third bitstring comprises:
applying a binary search over a measure of distance; or
randomly selecting each bit value over the measure of distance.

15. The method of claim 12, wherein the bitstring format comprises one or more of a protocol format or one or more storage rules for a storage system.

16. A system comprising:
a first node;
a second node that exchanges data with the first node using first protocol messages that conform to a first bitstring format for a first protocol, the first bitstring format having one or more first fixed bits with respective bit values required to satisfy requirements of the first protocol and also having one or more first free bits; and
a third node that exchanges data with the second node using protocol messages that conform to a second bitstring format for a second protocol, the second bitstring format having one or more second fixed bits with respective bit values required to satisfy requirements of the second protocol and also having one or more second free bits.

17. The system of claim 16,
wherein the second node receives a received message of the first protocol messages, the received message comprising a first bitstring having first bit values for the one or more first free bits of the first bitstring, and
wherein the second node generates a generated message of the second protocol messages, the generated message comprising a second bitstring having at least some of the first bit values from the received message as bit values of the one or more second free bits for the second bitstring.

18. A non-transitory computer-readable medium comprising instructions for identifying fixed bits of a bitstring format, the instructions configured to cause processing circuitry to:
generate a first bitstring having, for a first set of bits of the first bitstring, respective first bit values that have a first satisfiability state for requirements of the bitstring format;
generate a second bitstring having, for a second set of bits of the second bitstring, respective second bit values that have a second satisfiability state for the requirements of the bitstring format, the second satisfiability state different than the first satisfiability state;
identify first potential free bits having respective first common values in the first set of bits and in the second set of bits;
generate a third bitstring having, for a third set of bits of the third bitstring, the first potential free bits with the respective first common values and third remaining bits, the third set of bits having respective third bit values that have the second satisfiability state for the requirements of the bitstring format;
identify second potential free bits in the first set of bits and in the third set of bits having respective second common values;
identify a fixed bit that is not included in the first potential free bits and is not included in the second potential free bits;
output an indication of the fixed bit and a fixed bit value of the fixed bit, the fixed bit value being a corresponding value for the fixed bit that satisfies the requirements of the bitstring format.

19. The non-transitory computer-readable medium of claim 18, wherein the instructions further cause the processing circuitry to:
generate a fourth bitstring having, for a fourth set of bits of the fourth bitstring, the second potential free bits with the respective second common values and fourth remaining bits,
when the fourth set of bits have respective fourth bit values that have the second satisfiability state for requirements of the bitstring format, identify third potential free bits in the first set of bits and in the fourth set of bits having respective third common values;
when the fourth set of bits have respective fourth bit values that have the first satisfiability state for requirements of the bitstring format, identify the third potential free bits in the third set of bits and in the fourth set of bits having respective fourth common values, and
wherein to identify the fixed bit that is not included in the first potential free bits and is not included in the second potential free bits, the one or more processors are configured to further identify the fixed bit to be not included in the third potential free bits.

20. The non-transitory computer-readable medium of claim 18, wherein the bitstring format comprises one or more of a protocol format or one or more storage rules for a storage system.

* * * * *